US008218148B2

(12) United States Patent
Arnz

(10) Patent No.: US 8,218,148 B2
(45) Date of Patent: Jul. 10, 2012

(54) METHOD AND APPARATUS FOR MEASURING SCATTERED LIGHT ON AN OPTICAL SYSTEM

(75) Inventor: Michael Arnz, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 109 days.

(21) Appl. No.: 12/703,829

(22) Filed: Feb. 11, 2010

(65) Prior Publication Data

US 2010/0208254 A1 Aug. 19, 2010

Related U.S. Application Data

(63) Continuation of application No. PCT/EP2008/006498, filed on Aug. 7, 2008.

(60) Provisional application No. 60/955,065, filed on Aug. 10, 2007.

(30) Foreign Application Priority Data

Aug. 10, 2007 (DE) .......................... 10 2007 038 057

(51) Int. Cl.
*G01N 21/55* (2006.01)
(52) U.S. Cl. ..................................................... 356/445
(58) Field of Classification Search .................. 356/445
See application file for complete search history.

(56) References Cited

U.S. PATENT DOCUMENTS 6,650,399 B2 11/2003 Baselmans et al.
(Continued)

FOREIGN PATENT DOCUMENTS

| EP | 1411393 A2 | 4/2004 |
|----|-----------|--------|
| WO | 2005/015313 A1 | 2/2005 |
| WO | 2006/097330 A1 | 9/2006 |

OTHER PUBLICATIONS

J. Kirk, "Scattered Light in Photolithographic Lenses", SPIE vol. 2197 (1994), p. 566-572.

*Primary Examiner* — Roy M Punnoose
(74) *Attorney, Agent, or Firm* — Sughrue Mion, PLLC

(57) ABSTRACT

A method of measuring scattered light on an optical system includes: providing a first measuring field and a second measuring field, both measuring fields respectively being either of a first light manipulation type or a second light manipulation type, which first light manipulation type is configured to cause incoming light to enter the optical system and which second light manipulation type is configured to prevent incoming light from entering the optical system, and both measuring fields respectively having a second light manipulation type reference structure and a respective measuring structure, which measuring structures are of the second light manipulation type in the case where the measuring fields are of the first light manipulation type, and are first light manipulation type regions of the measuring fields in the case where the measuring fields are of the second light manipulation type, wherein the measuring structures of the respective measuring fields are offset in different directions in relation to the respective reference structure, imaging the first measuring field with the optical system into an image plane and measuring a first light intensity produced herewith at a location in the region of the image of the reference structure of the first measuring field, and imaging the second measuring field with the optical system into the image plane and measuring a second light intensity produced herewith at a location in the region of the image of the reference structure of the second measuring field.

23 Claims, 7 Drawing Sheets

U.S. PATENT DOCUMENTS

| | | | |
|---|---|---|---|
| 6,862,076 B2 * | 3/2005 | Mulder et al. | 355/40 |
| 6,986,973 B2 | 1/2006 | Yao et al. | |
| 2003/0068565 A1 | 4/2003 | Ki et al. | |
| 2004/0160588 A1 * | 8/2004 | Mulder et al. | 355/67 |
| 2005/0270523 A1 | 12/2005 | Wu et al. | |
| 2006/0046167 A1 | 3/2006 | Wu et al. | |
| 2006/0080046 A1 | 4/2006 | Ziger et al. | |
| 2006/0238749 A1 | 10/2006 | Hikima | |

* cited by examiner

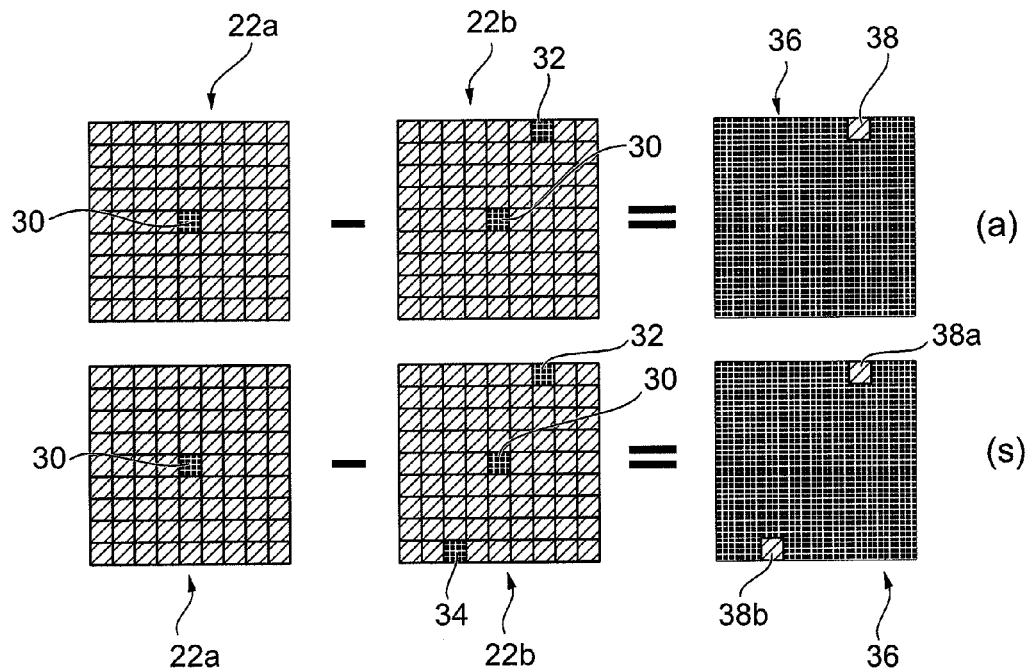
FIG. 3
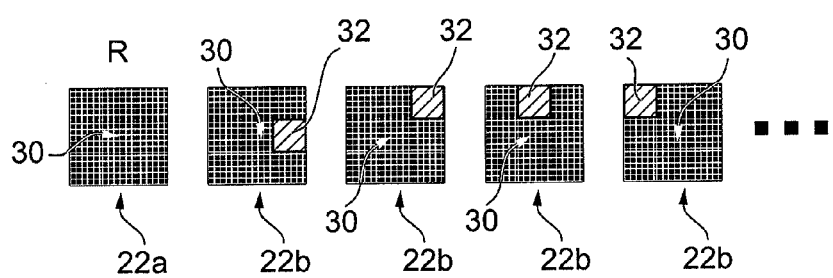
FIG. 4
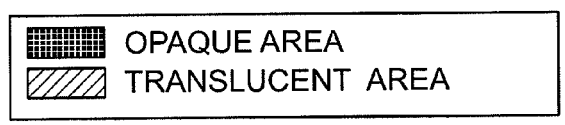

METHOD AND APPARATUS FOR MEASURING SCATTERED LIGHT ON AN OPTICAL SYSTEM

CROSS-REFERENCE TO RELATED APPLICATIONS

This is a Continuation of International Application PCT/EP2008/006498, with an international filing date of Aug. 7, 2008, which was published under PCT Article 21(2) in English, and the complete disclosure of which is incorporated into this application by reference; this application also claims the benefit under 35 U.S.C. §119(e) of U.S. Provisional Application No. 60/955,065, filed Aug. 10, 2007, as well as the benefit of German Application No. 10 2007 038 057.9 filed Aug. 10, 2007, the entire disclosures of which are incorporated into this application by reference.

FIELD OF AND BACKGROUND OF THE INVENTION

The invention relates to a method and to an apparatus for measuring scattered light on an optical system. The invention further relates to a projection exposure tool for microlithography with this type of apparatus and to a mask for measuring scattered light on an optical system. Further the invention relates to a method of operating a projection exposure tool for microlithography.

With systems for microlithography scattered light measurement is a very important measuring method in order to be able to qualify the associated optical system. Therefore, for the qualification of an optical system for microlithography, such as for example a projection objective, it is no longer sufficient to only measure the low aberrations or imaging errors, and in fact for an accurate forecast of the lithographic properties of the optical system knowledge of the scattered light portion of the light radiation conveyed through the optical system is of crucial significance. Generally, with optical systems for lithography the scattered light portion is determined with a mask which has an opaque square structure in a translucent environment. The mask is exposed in a number of steps with an increasing dose until the photoresist is developed on a wafer in the image plane of the optical system at the location of the opaque structure. The information regarding the scattered light portion in the optical system obtained with this method is however often not sufficiently meaningful, in particular for microlithography.

OBJECTS AND SUMMARY OF THE INVENTION

It is an object of the invention to resolve the aforementioned problems, and in particular to improve a method and an apparatus for measuring scattered light on an optical system such that more meaningful scattered light measurement results can thus be obtained.

The object is achieved, according to one formulation of the invention, with a projection exposure tool for microlithography comprising a measuring apparatus configured to perform a directionally resolved scattered light measurement inside the projection exposure tool. Therefore the measuring apparatus allows to establish the scattered light directionally resolved. The projection exposure tool comprises a projection objective for imaging mask structures onto a wafer and the apparatus in particular is configured to perform the directionally resolved scattered light measurement regarding light having traversed the projection objective. In one variation according to the invention the measuring apparatus is securely integrated into the projection exposure tool. The projection exposure tool can e.g. be in the form of a so-called stepper or scanner and for example be designed for an exposure wavelength of 248 nm, 193 nm or also for a wavelength in the extreme ultraviolet (EUV) wavelength range, e.g. for a wavelength smaller than 100 nm, in particular for 13.4 nm.

The term "directionally resolved scattered light measurement" in this context means that a scattered light portion is determined for each of at least two different scattering directions.

In an alternative embodiment of the invention a projection exposure tool for microlithography is provided comprising a measuring apparatus configured to perform a directionally dependent scattered light measurement. Such a directionally dependent scattered light measurement generates a measurement result in which in contrast to the result of an isotropic measurement the intensity of at least one propagation direction of the incoming scattered light is weighted into the measurement result stronger than the intensities of other propagation directions. A measurement resulting in a single measurement value, which sums up the intensity of scattered light originating from different scattering directions, wherein the light is weighted differently depending on the scattering direction applies different weightings to scattered light of different scattering directions is considered a directionally dependent scattered light measurement. Further a measurement measuring scattered light having a single propagation direction or an angular range of propagation directions smaller than 360° is considered a directionally dependent scattered light measurement. Therefore a directionally dependent scattered light measurement can also measure the intensity of scattered light originating from only one direction.

As detailed above the directionally resolved measurement result according to the invention contains an angularly dependent relative intensity distribution of the scattered light. For example the intensity of scattered light having a propagation direction along the x-coordinate is determined relative to the intensity of scattered light having a propagation direction along the y-coordinate in projection onto the image plane of the exposure tool. The directionally resolved scattered light measurement result may also contain an intensity distribution of the scattered light angularly resolved over a range of angles from 0° to 360° for the propagation direction of the scattered light in the image plane.

In an embodiment the projection exposure tool according to the invention further comprises a control apparatus configured to control an exposure operation of the projection exposure tool dependent on the measurement result obtained by the measuring apparatus. For example the angular distribution of the illumination light and/or the numerical aperture of the projection objective of the exposure tool can thereby be corrected as described in more detail later.

In a further embodiment the projection exposure tool is configured for operation in the extreme ultraviolet (EUV) wavelength range and/or a wavelength range of shorter wavelength. In this case the projection objective of the exposure tool is preferably configured catoptrical, i.e. with mirrors. In one variation the measuring apparatus comprises a transmission mask, in another variation a reflective mask.

In a further variation according to the invention the measuring apparatus comprises a switchable mask. Such a switchable mask can for example comprise a multi mirror array in form of a micro electro mechanical mirror system (MEMS). The basic concept of an MEMS is known to the person skilled in the art.

The object is further achieved, according to another formulation of the invention, with a method of operating a projection exposure tool for microlithography comprising: performing a directionally resolved scattered light measurement inside the projection exposure tool. In an embodiment according to the invention at least one parameter of the projection exposure tool is modified dependent on the result of the scattered light measurement. In case the result deviates from a desired scattered light performance the at least one parameter of the projection exposure tool is modified or influenced as a function of the scattered light measurement result. Examples of parameters which can be modified or influenced are described later.

The object is achieved, according to yet another formulation of the invention, with a method of measuring scattered light on an optical system. The method according to the invention comprises: providing a first measuring field and a second measuring field, both measuring fields respectively being either of a first light manipulation type or of a second light manipulation type, which first light manipulation type is configured to cause incoming light to enter the optical system and which second light manipulation type is configured to prevent incoming light from entering the optical system, and both measuring fields respectively having a second light manipulation type reference structure and a respective measuring structure, which measuring structures are of the second light manipulation type in the case where the measuring fields are of the first light manipulation type, and are first light manipulation type regions of the measuring fields in the case where the measuring fields are of the second light manipulation type, wherein the measuring structures of the respective measuring fields are offset in different directions in relation to the respective reference structure. Therefore the respective centers of area of the measuring structures of the respective measuring fields are offset in different directions in relation to the respective center of area of the respective reference structure.

Put in different words, the measuring structure of the first measuring field is offset in another direction in relation to the reference structure of the first measuring field than the measuring structure of the second measuring field is offset in relation to the reference structure of the second measuring field. The method further comprises: imaging the first measuring field with the optical system into an image plane and measuring a first light intensity produced herewith at a location in the region of the image of the reference structure of the first measuring field, and imaging the second measuring field with the optical system into the image plane and measuring a second light intensity produced herewith at a location in the region of the image, in particular within the image area, of the reference structure of the second measuring field. In an embodiment according to the invention the method comprises" establishing a measurement result in form of a directionally resolved scattered light distribution by evaluating the first light intensity measured and the second light intensity measured. According to a further embodiment of the invention further a reference field is provided, which reference field has the same light manipulation property as the measuring fields, i.e. is either of the first light manipulation type or of the second light manipulation type, and has a second light manipulation type reference structure.

In a first variation the above method comprises: providing a first measuring field and a second measuring field, both measuring fields respectively being of a first light manipulation type, which first light manipulation type is configured to cause incoming light to enter the optical system, and both measuring fields respectively having a second light manipulation type reference structure, which second light manipulation type is configured to prevent incoming light from entering the optical system, and both measuring fields having a respective measuring structure, which measuring structures are of the second light manipulation type, wherein the measuring structures of the respective measuring fields are offset in different directions in relation to the respective reference structure, imaging the first measuring field with the optical system into an image plane and measuring a first light intensity produced herewith at a location in the region of the image of the reference structure of the first measuring field, and imaging the second measuring field with the optical system into the image plane and measuring a second light intensity produced herewith at a location in the region of the image of the reference structure of the second measuring field.

In a second variation the above method comprises: providing a first measuring field and a second measuring field, both measuring fields respectively being of a second light manipulation type, which second light manipulation type is configured to prevent incoming light from entering the optical system, and both measuring fields respectively having a second light manipulation type reference structure and a respective measuring structure, which measuring structures are of a first light manipulation type, which first light manipulation type is configured to cause incoming light to enter the optical system, wherein the measuring structures of the respective measuring fields are offset in different directions in relation to the respective reference structure, imaging the first measuring field with the optical system into an image plane and measuring a first light intensity produced herewith at a location in the region of the image of the reference structure of the first measuring field, and imaging the second measuring field with the optical system into the image plane and measuring a second light intensity produced herewith at a location in the region of the image of the reference structure of the second measuring field.

According to the invention further a mask for measuring scattered light on an optical system is provided. The mask has a first measuring field and a second measuring field, both measuring fields respectively being either of a first light manipulation type or a second light manipulation type, which first light manipulation type is configured to cause incoming light to enter the optical system and which second light manipulation type is configured to prevent incoming light from entering the optical system, and both measuring fields respectively having a second light manipulation type reference structure and a respective measuring structure, which measuring structures are of the second light manipulation type in the case where the measuring fields are of the first light manipulation type, and are first light manipulation type regions of the measuring fields in the case where the measuring fields are of the second light manipulation type, wherein the measuring structures of the respective measuring fields are offset in different directions in relation to the respective reference structure. In an embodiment of this mask the respective reference structure is a second light manipulation type region in a first light manipulation type environment or a second light manipulation type environment.

According to the invention further an apparatus for measuring scattered light on an optical system is provided. The apparatus comprises: a first measuring field and a second measuring field, both measuring fields respectively either being of a first light manipulation type or a second light manipulation type, which first light manipulation type is configured to cause incoming light to enter the optical system and which second light manipulation type is configured to prevent incoming light from entering the optical system, and both measuring fields respectively having a second light manipulation type reference structure and a respective measuring structure, which measuring structures are of the second light manipulation type in the case where the measuring fields are of the first light manipulation type, and are first light manipulation type regions of the measuring fields in the case where the measuring fields are of the second light manipulation type, wherein the measuring structures of the respective measuring fields are offset in different directions in relation to the respective reference structure. The apparatus further comprises a device for measuring a first light intensity which is produced when imaging the first measuring field with the optical system into an image plane, the measuring device for measuring the first light intensity being disposed at a measuring location in the region of the image of the reference structure of the first measuring field, and a device for measuring a second light intensity which is produced when imaging the second measuring field with the optical system into the image plane, the measuring device for measuring the second light intensity being disposed at a measuring location in the region of the image of the reference structure of the second measuring field. Advantageously the device for measuring the first light intensity and the device for measuring the second light intensity are the same measuring device, i.e. the first light intensity and the second light intensity is measured with the same measuring device.

According to a first embodiment the elements, i.e. the fields or structures, of the first light manipulation type are translucent elements and the elements of the second light manipulation type are opaque elements. This configuration is advantageously implemented on a transmission mask for a projection exposure tool, i.e. a mask configured to image mask structures into the wafer plane by light transmitted by the mask. The property of translucency or opacity relates here to light of a wavelength range with which the measuring fields are imaged with the optical system into an image plane of the optical system. Light in accordance with the application is visible light, but also light in the UV range, e.g. with a wavelength of 248 nm or 193 nm, and in particular light in the EUV wavelength range.

According to a second embodiment the elements of the first light manipulation type are light reflecting elements and the elements of the second light manipulation type are light absorbing elements. This configuration is advantageously implemented on a reflective mask for a projection exposure tool used in particular with light in the EUV-wavelength range. Such a reflective mask configured to image mask structures into the wafer plane by light reflected by the mask.

According to a third embodiment the elements of the first light manipulation type are formed by micro-mirrors aligned to direct incoming light into the optical system and the elements of the second light manipulation type are formed by micro-mirrors aligned to direct incoming light into directions outside the capture range of the optical system. This configuration is advantageously implemented by the use of a switchable mask having a micro electro mechanical mirror array (MEMS).

The above described measurement method, measurement mask and measurement apparatus allow the performance of a directionally resolved scattered light measurement in the denotation explained previously. The solution according to the invention is based in particular upon the finding that more meaningful scattered light measurement results can be obtained if the scattered light produced is established directionally resolved. This type of directionally resolved scattered light measurement is made possible according to the invention in particular by providing both of the aforementioned measuring fields. As already mentioned, both measuring fields respectively have a second light manipulation type reference structure. The measuring fields can basically either be designed to be of the first light manipulation type or of the second light manipulation type. If both measuring fields are of the first light manipulation type, the reference structure respectively forms a second light manipulation type region of the measuring fields. If the measuring fields are of the second light manipulation type, the reference structures are respectively second light manipulation type regions in an environment which is also of the second light manipulation type. In this case the reference structure passes into its environment. The second light manipulation type measuring fields are advantageously aligned prior to exposure using their own adjustment structures in relation to the measuring location. These types of adjustment structure can for example be designed as first light manipulation type crosses and be disposed approximately 2.0 mm from the location of the reference structure. In this embodiment every second light manipulation type measuring field should have at least one adjustment structure, preferably at the respective same location. When using first light manipulation type measuring fields with a second light manipulation type reference structure, the respective reference structure can be used to adjust the measuring fields.

The measuring fields additionally have a respective measuring structure offset in relation to the reference structure. In the case where the measuring fields are of the first light manipulation type, the measuring structure is in the form of a second light manipulation type region of the second measuring field. However, in the case where the measuring fields are of the second light manipulation type, the measuring structure is in the form of a first light manipulation type region of the second measuring field. Both the first measuring field and the second measuring field are imaged one after the other with the optical system into an image plane. This happens by illuminating the measuring fields with the aforementioned light. With each imaging step a light intensity is measured at a measuring location in the image plane using a measuring device, the measuring location being in the region of the location in the image plane where the respective reference structure of the measuring fields is imaged. In an embodiment according to the invention the reference structures of both measurement fields are imaged onto the same measurement location.

By evaluating both light intensities measured, the scattered light portion of the light conveyed through the optical system can be determined, the scatter direction of which corresponds to the direction which is formed by a direction vector pointing from the measuring structure to the reference structure of the respective measuring field. In other words, one can determine the light portion which, in the example in which the measuring structure is in the form of a first light manipulation type region, passes through the measuring structure and in the image plane strikes the measuring location where the reference structure is imaged. In the case where the measuring structure is in the form of a second light manipulation type region this directionally dependent scatter portion can be established by corresponding reverse observation. By varying the distance between the measuring structure and the reference structure one can additionally establish the scattered light portion as a variation of the scatter range.

Due to the use of two measuring fields having measuring structures being offset differently with respect to the respective reference structure according to the invention the scattered radiation produced by the optical system can therefore be established directionally resolved. In other words, the measuring method according to the invention allows the characterisation of anisotropic scattered light. The measurement result can be compared directly with a theoretical forecast. A difference between the theoretical forecast and the measurement result can for example result from anisotropic surfaces and volume inhomogeneities of individual lens elements of the optical system. The invention further enables monitoring of the scattered light characteristics of optical systems in order to identify "escapees" by making a relative comparison of different optical systems.

The measuring method according to the invention is a supplement to the wave-front measurement of high frequency aberrations which are generally anisotropic and dependent upon sampling, i.e. due to the limited pixel number over the pupil, not sufficiently resolvable using the wave-front measuring technique. High frequency and generally non-rotationally symmetrical aberrations typically often originate from optical surfaces of the optical system close to the pupil. This is due to the fact that here both the size of the subaperture, i.e. the surface which is crossed by the beam bundle belonging to one field point and also the number of oscillations of the aberrations over the pupil becomes maximal (e.g. with a fixed "grid period" of the aberration on the optical surface). This leads to field-constant scattered light—for surfaces close to the pupil the subapertures coincide at different field points— and is consistent with the experience that scatter effects often only have small field dependency.

In the case where scatter effects caused by multiple reflections play a large role in the optical system, a field dependency of the scattered light often occurs. In this case it is advantageous to take the scattered light measurement according to the invention at different field points. Due to the anisotropic scanner slot geometries, scatter effects caused by multiple reflections have a highly anisotropic effect.

Furthermore, the invention makes it possible to establish a preferred direction when working with individual lenses—or reflecting surfaces in the optical system. Furthermore, the invention makes it possible to define a preferred direction when coating the optical surfaces with anti-reflection coating or multilayers (multiple coating), e.g. using anisotropic sputtering and/or a preferred direction of contamination of the optical surfaces, such as for example the flow direction of the contamination source. The preferred directions can be potential sources of anisotropic wave-fronts and so also of anisotropic scattered light distribution. The directionally resolved measurement of the corresponding scattered light distribution according to the invention therefore makes it possible to establish preferred directions of the aforementioned type. It is assumed that a "particle size" (extension) of a contamination of an optical surface of the optical system correlates with the period length of an anisotropic grid which describes the contamination on the optical surface. As an example the anisotropic grid N may have spatial oscillations over the subaperture of the optical surface assigned to a pixel. Therefore, a so-called scatter range Δx, which specifies the distance between the scatter maximum and the ideal pixel, can be calculated as follows on the basis of the wavelength λ of the illumination light and the numerical aperture NA of the optical system: $\Delta x = N \cdot \lambda / 2NA$ Furthermore, the invention enables diagnostication and compensation of polarisation effects which are effective dependently upon direction and which act in the same way as anisotropic scattered light and non-rotationally symmetrical aberrations, and can lead for example to differences between horizontally orientated structures in relation to the line width of vertically orientated structures (so-called CD anisotropies).

According to the invention a further method of measuring scattered light on an optical system is provided. This method comprises: providing a reference field and a measuring field, both fields respectively being either of the first light manipulation type or of the second light manipulation type, and both fields respectively having a second light manipulation type reference structure, the measuring field additionally having a measuring structure, and the measuring structure is of the second light manipulation type in the case where the fields are of the first light manipulation type, and is a first light manipulation type region of the measuring field in the case where the fields are of the second light manipulation type, wherein the center of area of the measuring structure is offset in relation to the center of area of the associated reference structure. The method further comprises: imaging the reference field with the optical system into an image plane and measuring a first light intensity produced herewith at a measuring location in the region of the image of the reference structure of the reference field, and imaging the measuring field with the optical system into the image plane and measuring a second light intensity produced herewith at a measuring location in the region of the image of the reference structure of the measuring field, in particular within the image area. The image of the measuring structure in the image plane is offset in relation to the measuring location in the region of the image of the reference structure of the measuring field by at least 300 μm. This offset refers to a deviation in the image plane. In case of a 4:1 reduction ratio, the measuring structure in the object plane, e.g. on a respective measuring mask is offset with respect to the reference structure of the measuring field by at least 1.2 mm.

The elements of the first light manipulation type and the second light manipulation type can be configured as described above, e.g. as translucent and opaque elements.

In a further embodiment according to the invention a directionally dependent scattered light portion of the light passing through the optical system is established by assessing the first light intensity measured and the second light intensity measured. In a further embodiment according to the invention the directionally dependent scattered light portion is established by calculating the difference between the first light intensity measured and the second light intensity measured.

Further according to the invention a mask is provided, which mask is for measuring scattered light on an optical system having a measuring field which has a measuring structure offset by at least 1.2 mm in relation to the area center of the measuring field, the measuring structure being a structure the edge of which encloses a region of the measuring field which is uniform as regards its light manipulation property, in particular its light transmission property. In an embodiment of this mask the measuring field is either of the first light manipulation type or of the second light manipulation type and the measuring structure is of the second light manipulation type in the case where the measuring field is of the first light manipulation type, and is a first light manipulation type region of the measuring fields in the case where the measuring field is of the second light manipulation type.

In an embodiment according to the invention each measuring structure is offset by maximum 2.0 mm in relation to the reference structure of the respective measuring field. In a further embodiment each measuring structure has a dimension of at least 10 μm, in particular of at least 20 μm, i.e. the measuring structure is at least in one direction at least 10 μm in size. In the case where the measuring structure is imaged using a scanner for microlithography with a reduction ratio of 1:4, the minimum dimension of the measuring structure in the image plane is 2.5 μm, and in particular 5 μm. It is therefore sufficiently dimensioned in order to bring about a significant change in the light intensity measured at the imaging location of the reference structure. The distance between the reference structure and the measuring structure on the mask is maximum 2.0 mm, and in particular maximum 1.0 mm. In the case where the structures are imaged using the aforementioned scanner, the distance between the reference structure and the measuring structure in the image plane is maximum 500 μm, and in particular 250 μm. It is therefore guaranteed that scattered light with a scatter range which is typically significant with lithographic images can be measured. The minimum distance between the center points of the reference structure and the measuring structure is advantageously in the range of the minimum dimension of the measuring structure. The mask according to the invention makes it possible to implement the method according to the invention for measuring scattered light with the result of a directionally resolved scattered light measurement. The first measuring of the method according to the invention, with which the first measuring field is imaged, can be implemented using a corresponding measuring field on the same mask or on another mask.

According to a further embodiment each field, i.e. each measuring field and/or the reference field, has a dimension of at least 2.4 mm. That means each field is in at least one direction at least 2.4 mm in size. In further embodiments each field has a dimension of at least 3.0 mm or at least 5.0 mm.

In a further embodiment according to the invention the measuring location for measuring the first and/or second light intensity is configured as a two-dimensional area having a maximum lateral dimension of at most 10 μm. Therefore the measurement area is smaller than or at the most 10 μm in any lateral direction. In a further embodiment the measurement area has a maximum lateral dimension of at most 5 μm, in particular of at most 1 μm. With the measurement area being dimensioned this way short range scattering light can be detected properly. Advantageously the measurement area is dimensioned in both orthogonal directions about the same, e.g. the measurement area is square in shape having a side length of at most 10 μm, in particular 5 μm or 1 μm. The measurement can be performed by e.g. a CCD-detector arranged at the measuring location in the image plane. In this case a variable aperture can be used to adjust the effective measurement area on the detector depending on the scattering range investigated. Alternatively the image at the measurement area can be magnified using a micro objective and recorded by a CCD-detector arranged in the image plane of the micro objective. In this case the effective measurement area on the detector can be adjusted using a variable magnification of the micro objective.

In another embodiment according to the invention the measuring location for measuring the first and/or second light intensity is configured as a two-dimensional area having a lateral dimension of at least 50 μm, in particular at least 100 μm or at least 200 μm. With the measurement area being dimensioned this way medium and long range scattering light can be measured directionally resolved properly. Compared to an isotropic scattered light measurement less light per area is received at the measurement location in case of the directionally resolved measurement.

The reference structure and the measuring structure respectively are preferably structures the respective edge of which encloses a region of the respective measuring field which is uniform as regards its light transmission property. In other words, the reference structure and the measuring structure are respectively two-dimensionally filled structures, i.e. they contain no gaps. In particular the area center of the respective structure is part of the structure. The measuring structure is therefore either a totally first light manipulation type or totally second light manipulation type structure, and the same applies to the reference structure.

In one embodiment of the invention the reference structure is a second light manipulation type region in a first light manipulation type environment or a second light manipulation type environment. In the case where the reference structure is disposed in a second light manipulation type environment the reference structure passes into its environment.

Further, the aforementioned object is achieved with an apparatus for measuring scattered light on an optical system and which comprises a mask in one of the aforementioned embodiments according to the invention.

In one embodiment of the method according to the invention and of the apparatus according to the invention the respective reference structure and the respective measuring structure are respectively second light manipulation type regions of the corresponding measuring field disposed in a first light manipulation type environment. Therefore, when imaging the structures with the optical system, dark regions are produced in the image plane.

In a further embodiment according to the invention the respective reference structure is a respective second light manipulation type region of the corresponding measuring field disposed in a second light manipulation type environment, and the measuring structure is a first light manipulation type region of the second measuring field disposed in a second light manipulation type environment. Therefore, the first measuring field can in particular be designed to be totally of the second light manipulation type.

In a further embodiment according to the invention both measuring fields are of the same size. In particular, both measuring fields are identical in shape and size. Therefore, it is possible to determine the directionally resolved scattered light particularly accurately since the scattered light background for both measurements is the same here. The size of the measuring fields determines the catchment area for scattered light arriving at the measuring location. By designing both measuring fields to be of the same size, when assessing the light intensities measured the corresponding background effects (e.g. long-range scattered light) can be taken out from the directionally dependent scattered light measurement result.

In a further embodiment according to the invention the measurement of the first light intensity and the measurement of the second light intensity are performed successively in time. With this it is possible to determine the scattering behavior of the optical system directionally resolved at a particular field point or respectively at several field points.

In an embodiment according to the invention the fields are imaged into the image plane using light in the extreme ultraviolet (EUV) wavelength range and/or a wavelength range of shorter wavelength. Extreme ultraviolet light can e.g. have a wavelength of 13.4 nm.

In a further embodiment according to the invention an exposure correction for reducing the scattered light of the optical system during operation of the latter is determined from the measurement result either in form of the directionally dependent scattered light portion or the directionally resolved scattered light distribution. In other words, the scattered light measurement result is used in order to change at least one exposure parameter when exposing a mask in order to image the latter with the optical system such that the scattered light occurring when imaging is reduced.

In a further embodiment according to the invention, after establishing the directionally dependent scattered light portion an imaging condition is changed, both fields, i.e. either both measuring fields or the reference field and the measuring field, are imaged once again under the changed imaging condition, and the scattered light portion is determined once again under the changed imaging condition. From the change to the scattered light portion or distribution under the changed imaging condition, an improved imaging condition can then be established for the exposure operation of the optical system.

In a further embodiment according to the invention, when imaging the measuring fields using the optical system, the measuring fields are respectively illuminated with illumination light the individual beams of which have a pre-specified angular distribution, and the exposure correction determined defines a correction to the angular distribution of the illumination light and/or of the numerical aperture of the optical system. In other words, a correction to the illumination setting utilizing the method according to the invention is determined such that in this way the scattered light portion is reduced. The illumination setting can for example comprise so-called on-axis illumination with various coherence, annular illumination or quadrupole illumination, and defines the angular distribution of the illumination light hitting the mask. In a further embodiment according to the invention the exposure correction determined defines a correction to the numerical aperture of the optical system in order to reduce the scattered light portion. In a further embodiment according to the invention the polarisation dependency of the scattered light characteristics is determined. Together with a polarisation-dependent wave-front measurement and a field-dependent transmission measurement the optical system can be characterised comprehensively according to the invention. The measurement results can also be used in order to optimise the imaging characteristics of the optical system dependently upon the structure to be imaged with an optical simulator.

In a further embodiment according to the invention the exposure correction determined defines a correction to the layout of a mask to be exposed. The directionally dependent scattered light distribution determined with the method according to the invention can be used to produce an adapted mask layout with which anisotropic scattered light can generally be compensated. The compensation method can for example be implemented in the same way as the optical close range correction known to the person skilled in the art (also known to the person skilled in the art as "Optical Proximity Correction"—OPC). As a result of the correction to the mask layout line width anisotropies (CD anisotropies) can for example be represented. This is particularly advantageous if the cause of scattering, such as for example the processing, coating or contamination of optical surfaces, and so also anisotropy in particular with regard to its preferred direction is systematic over many optical systems.

In a further advantageous embodiment the exposure correction determined shows the necessity of eliminating contamination in the optical system. In particular in the development stage of the contamination an anisotropy of the layering or of the accretion in the form of anisotropic scattering is visible, even before the whole surface is contaminated homogeneously (for example in monolayers etc.), and this can be demonstrated in a known way through transmission loss. The method according to the invention therefore enables early identification of surface contamination which primarily comes to light in anisotropic scattering, and would only become noticeable secondarily through transmission loss. Therefore the method according to the invention enables early identification of contamination.

In a further embodiment according to the invention a plurality of further measuring fields are provided, which further measuring fields in addition to the reference structure each have a respective further measuring structure which is offset in relation to the associated reference, the respective direction in which the individual measuring structure is offset in relation to the associated reference structure differing respectively from the directions in which the other measuring structures are offset in relation to the respective associated reference structure. Therewith the respective scattered light intensities from the different directions can be measured precisely. The more measuring fields there are, the more precisely the directional dependency of the scattered light distribution can be sampled.

According to a further embodiment the respective reference structures of at least two fields are configured the same, in particular have the same shape and size.

In a further embodiment according to the invention the measuring structure of the first measuring field is offset in relation to its associated reference structure in a vertical direction, the measuring structure of the second measuring field is offset in relation to its associated reference structure in a horizontal direction, and the relationship between the vertical and horizontal scattering efficiency, and so the HV anisotropy, of the optical system is established from the intensities measured.

In a further advantageous embodiment at least one measuring field has a second measuring structure which is disposed symmetrically to the first measuring structure in relation to the reference structure. With this type of triple arrangement, in comparison to the arrangement of just one measuring structure in addition to the reference structure in the corresponding measuring field a directionally dependent scattered light measurement with a pre-specified precision with regard to the direction resolution can be carried out with fewer measuring fields and so more efficiently. However, with the measurement result, scattered light portions with opposing scatter directions cannot be distinguished from one another. With the symmetrical arrangement of both measuring structures in relation to the reference structure scattered light is collected at the measuring location which is to be assigned either to the first or to the second measuring structure. How large the respective portions are which arise from the individual measuring structures lying opposite one another, cannot be distinguished in this configuration. The scattered beam measurement result obtained in this embodiment is therefore only resolved with regard to the orientation of "scatter axes" which have no preferred direction. This type of arrangement of triples is particularly advantageous with the measurement of the HV anisotropy of scattered light implemented according to the aforementioned embodiment.

In a further embodiment according to the invention a further second measuring field is provided which, in addition to the reference structure, has a further measuring structure, the further measuring structure being offset in relation to its associated reference structure in the same direction, but by a different distance, than the measuring structure of another measuring field is offset in relation to its associated reference structure. By additional measurement of the light intensity at the measuring location when imaging the further measuring field, the scattered light can additionally be determined range-resolved.

In a further embodiment according to the invention the fields are disposed on a common mask. The scattered radiation measurement can therefore be implemented without changing mask. The mask is advantageously moved appropriately in the mask plane between the two measurements.

In a further embodiment according to the invention the measuring structure and/or the respective reference structure are configured as structures the edges of which enclose a respective region of the respective measuring field which is uniform as regards its light transmission property. As already explained above, the structures are therefore either gap-free first light manipulation type or gap-free second light manipulation type regions.

In a further embodiment according to the invention the measuring structure and/or the respective reference structure have the shape of a polygon, in particular the shape of a tetragon or a square shape. In a further embodiment according to the invention the respective reference structure is disposed in the center of the corresponding field. In particular, the reference structure is disposed at the location of the area center of the corresponding field. This arrangement of the reference structure leads to the measuring location also being disposed centrally in the image of the measuring field. It is therefore possible to dispose the measuring structures in the individual measuring fields in different directions respectively the same distance away from the corresponding reference structure, and so to take a directionally resolved scattered light measurement based upon uniform scatter ranges. Furthermore, it is guaranteed by the central positioning of the reference structure that scattered light effects from outside the measuring field reach the measuring location as isotropically as possible. This reduces the error tolerances in the directionally-resolved scattered light measurement result.

In a further embodiment according to the invention the reference structure and the measuring structure form a continuous structure in the measuring field. In particular, the continuous structure can be configured as a rectangular structure which is orientated, for example, vertically or horizontally.

In a further embodiment according to the invention the light intensities are measured by a photoelectric detector, e.g. disposed at the measuring location. As already mentioned above, the photoelectric detector can also be disposed in an image plane of a micro objective imaging the intensity distribution at the measuring location onto the photoelectric detector. Therefore, the scattered light measurement can be implemented particularly efficiently as regards time and without complexity. In particular, the measurement can be implemented during production operation of an exposure tool for lithography between the exposure of individual wafers. In one embodiment the photoelectric detector has a collecting surface the maximum size of which is the size of the image of the reference structure on the image plane.

In a further embodiment according to the invention the light intensities are measured by a photochemical detector. A photochemical detector of this type can e.g. be a photochemical photoresist on a test wafer provided for the measurement. In order to measure the intensities the dose of radiation for each measuring field is advantageously successively increased until the photoresist is developed. From the ratio of the light dose which is required in order to produce a conventional image of a structure in the photoresist and the dose which is required in order to expose a region blocked off from the reference structure with light passing through the measuring structure, scattered light intensity arriving at the measuring location under normal exposure conditions can be calculated back.

The features specified in relation to the embodiments of the method according to the invention listed above can correspondingly be transferred to the apparatus according to the invention and to the mask according to the invention, and vice versa. The resulting embodiments of the apparatus according to the invention should be specifically included in the disclosure of the invention. Furthermore, the advantages listed above in relation to the embodiments of the method according to the invention therefore also relate to the corresponding embodiments of the apparatus according to the invention and of the mask according to the invention.

BRIEF DESCRIPTION OF THE DRAWINGS

In the following, exemplary embodiments of methods according to the invention, methods, masks and apparatuses for measuring scattered light on an optical system are described in greater detail with reference to the attached diagrammatic drawings. These show as follows.

DETAILED DESCRIPTION OF EXEMPLARY EMBODIMENTS ACCORDING TO THE INVENTION

Figure 1:
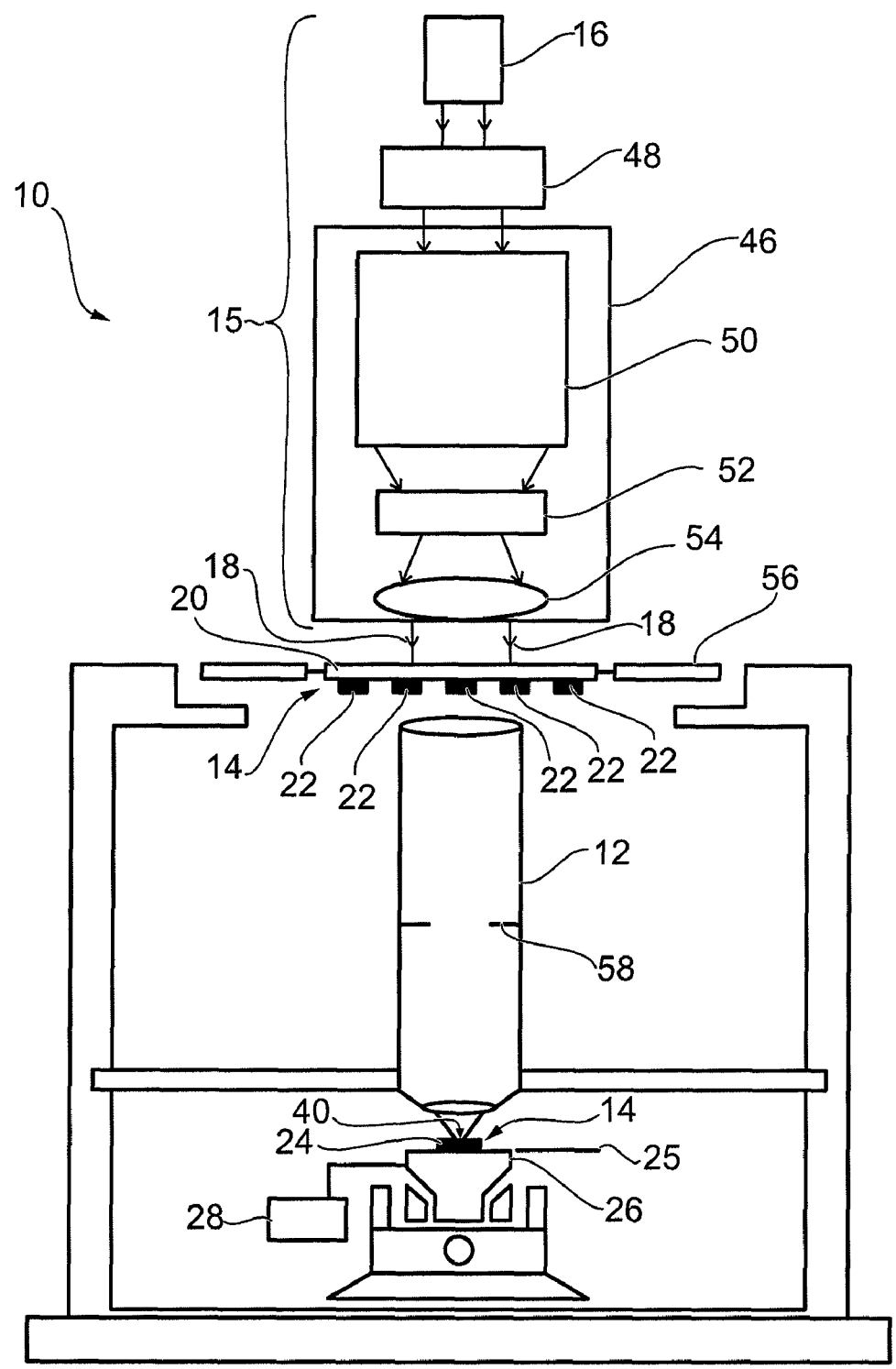
FIG. 1 an illustration, in principle, of an embodiment of a projection exposure tool for microlithography together with an apparatus according to the invention for measuring scattered light inside the projection exposure tool, FIG. 2 measuring fields in a first embodiment according to the invention which can be disposed on a mask of the apparatus for measuring scattered light according to FIG. 1 in different combinations, FIG. 3 an illustration of the mode of operation of a method according to the invention using selected measuring fields according to FIG. 2, FIG. 4 a combination of measuring fields in a further embodiment according to the invention, FIG. 5 further embodiments of measuring fields according to the invention and an illustration of the mode of function of a method according to the invention when using these measuring fields, FIG. 6 an illustration of one of the measuring fields shown in FIG. 5 together with a measuring surface of a detector for collecting a light intensity, FIG. 7 an illustration of a further one of the measuring fields shown in FIG. 5 together with the measuring surface of the detector, FIG. 8 an illustration, in principle, of another embodiment of a projection exposure tool for microlithography operating in the EUV wavelength range together with an apparatus according to the invention for measuring scattered light inside the projection exposure tool, FIG. 9 a cross sectional view of a multi mirror array for use as a mask e.g. with the projection exposure tool or FIG. 8, and FIG. 10 a top down view of a multi mirror array of the type shown in FIG. 9.

In the embodiments of the invention described below, components that are alike in function and structure are designated as far as possible by the same or like reference numerals. Therefore, to understand the features of the individual components of a specific embodiment, the descriptions of other embodiments or the summary of the invention should be referred to.

Figure 8:
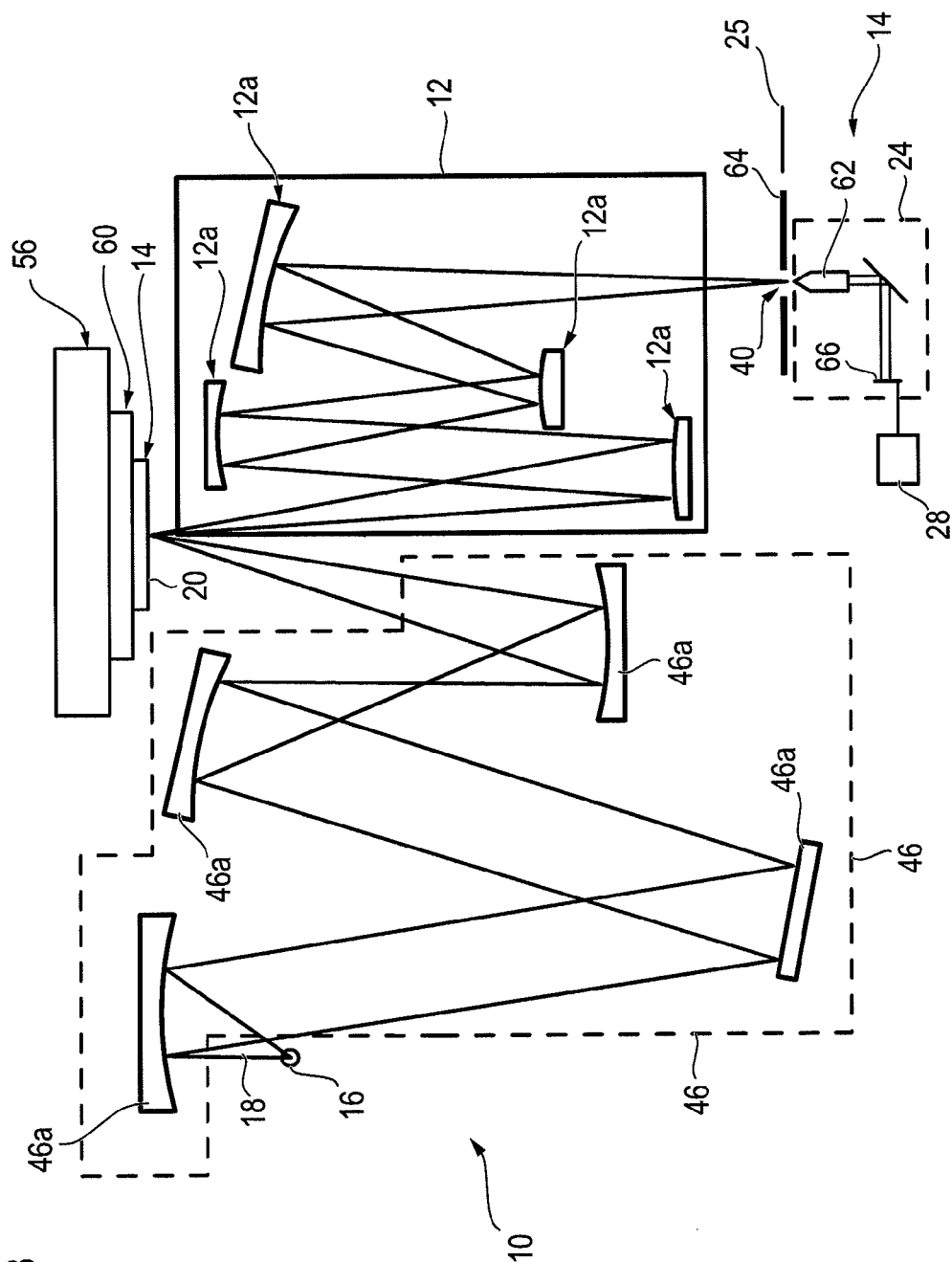

In FIGS. 1 and 8 different embodiments of exposure tools 10 for microlithography in the form of a projection exposure tool having an optical system 12 in the form of a projection objective are illustrated. In the following description reference is made to various elements of the exposure tool 10. Some of these elements may only be illustrated in one of FIGS. 1 and 8, however can be contained also in the embodiment of the other Figure. The projection exposure tool 10 shown in FIG. 1 is of a transmission type, i.e. it has a transmission mask 20, typically used with exposure light in the UV-wavelength region. A transmission mask can, however, also be used in case of an EUV-exposure tool. The projection exposure tool 10 shown in FIG. 8 is operated in the EUV-wavelength range and comprises a reflective mask 20.

The optical system 12 generally comprises a plurality of optical elements, which are in the case of the exposure tool 10 according to FIG. 1 lens elements and in the case of the exposure tool 10 according to FIG. 8, which is operating in the EUV-wavelength range, reflective elements 12a. The exposure tool can be designed as a stepper or scanner. On the optical system 12 an apparatus 14 is provided for measuring scattered light which is produced in the optical system 12 when one images with this object structures from a mask plane into an image plane 25 or wafer plane.

The optical system 12 has a pupil 58 disposed in a pupil plane, illustrated in FIG. 1. Generally the pupil 58 is a circular aperture which controls the numerical aperture of the radiation hitting the image plane 25. In order to image object structures from the mask plane into the image plane, the mask 20 is illuminated with an illumination system 15 which produces illumination radiation 18, in particular in the ultraviolet wavelength range and in case of FIG. 8 in the extreme ultraviolet wavelength range (EUV). The illumination system 15 comprises a light source 16 (e.g. in the form of a mercury lamp, an excimer laser for producing UV-light or an undulator disposed around a path of an electron beam in a storage ring or synchotron or of a plasma source for producing EUV-light) for producing a beam of electromagnetic radiation. This beam is fed either directly or after passing through a preparation unit 48, e.g. in the form of a beam expander, into an illuminator 46 comprising a number of optical elements, which are in the case of FIG. 8 reflective elements 46a. The illuminator 46 can have an illumination setting device 50 for setting the outer and/or inner radial extension (generally called an inner a or outer a) of the intensity distribution in the beam. In addition, the illuminator 46 generally has various further components such as for example an integrator 52 and a condenser 54. The illumination radiation 18 radiating onto the mask 20 thus has a desired uniformity and intensity distribution in the cross-section.

With reference to FIG. 1 it is established that the light source 16 can be disposed within the housing of the exposure tool 10, and this is often the case if the light source 16 is a mercury lamp. However, the light source 16 can also be separated spatially from the rest of the exposure tool 10. In this case the illumination radiation 18 produced by the light source 16 is guided, e.g. using an appropriate directing mirror, into the rest of the exposure tool 10. This is often the case when the light source 16 is in the form of an excimer laser.

The apparatus 14 for measuring scattered light comprises a mask 20 and a measuring device 24 positioned at a measuring location 40, which measuring location 40 can be in the form of a square measuring area illustrated below in more detail. The measuring device can be in the form of a photoelectric detector 24, e.g. a CCD-array, arranged in the image plane 24, as illustrated in FIG. 1. Alternatively the measuring device 24 can be configured as shown in FIG. 8. Here a field stop 64 defining the size of the measuring location is arranged in the image plane 25. The light distribution in the image plane 25 is magnified by a micro objective 62 and the magnified image is detected by a photoelectric detector 66 in form of a CCD-array arranged in the image plane of the micro objective 62.

The mask 20 has a plurality of fields 22 which will be described in greater detail below. The fields 22 are imaged one after the other with the optical system 12 into the image plane 25. Furthermore, the exposure tool 10 has a movable substrate table 26 (also called a "wafer stage"), illustrated in FIG. 1, on which the measuring device 24 is disposed. The measuring device 24 is positioned at a measuring location 40 in the image plane. In addition to the measuring device 24 the apparatus 14 further comprises an evaluation device 28 for evaluating light intensities measured with the measuring device 24.

The illumination radiation 18 passes through the mask 20 in the embodiment illustrated in FIG. 1 which is held by a mask holder 60 on a mask table 56 (also called a "reticle stage"). In the embodiment according to FIG. 8 the illumination radiation 18 is reflected at the mask 20. After interaction with the mask 20 the radiation passes through the optical system 12 which focuses the radiation into the image plane 25. Using the first positioning device (and interferometric measuring device) the substrate table 26 can be positioned precisely. In the same way a second positioning device are provided in order to position the mask 20 in relation to the beam of the illumination radiation 18, e.g. following mechanical delivery from a mask library or during exposure.

FIGS. 2 to 7 show examples of fields 22 disposed on the mask 20 of the transmission type shown in FIG. 1. Fields 22 disposed on a mask 20 of the reflection type as used in the exposure tool according to FIG. 8 are configured analogously. In the reflection mask 20 according to FIG. 8 elements, which are translucent on the transmission mask according to FIG. 1, are configured as reflective elements and mask elements, which are opaque on the transmission mask according to FIG. 1, are configured as light absorbing elements.

Figure 2:
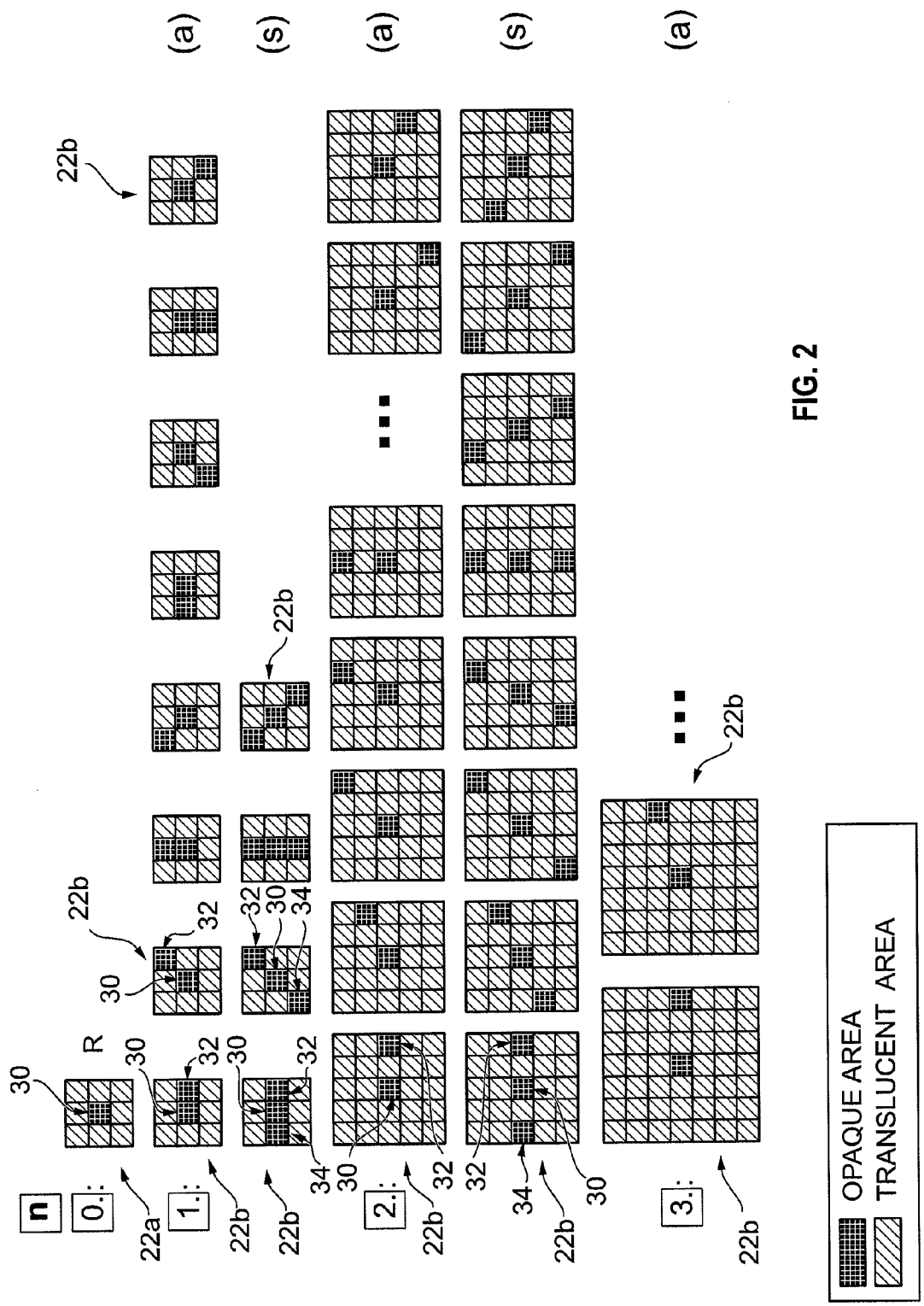

FIG. 2 shows examples of fields 22 disposed on the mask 20 according to FIG. 1 in a first embodiment. The fields 22 shown are ordered in so-called hierarchy levels n, the hierarchy levels being illustrated with n=0, 1, 2 and 3 in FIG. 2. The hierarchy level n=0 only has one field which in the following is called the reference field 22a and in its center has a reference structure 30 in the form of a continuously opaque square region. The reference field 22a is identified by R in FIG. 2.

According to the method according to the invention, first, the reference field 22a is initially imaged onto the image plane 25 such that the image of the reference structure 30 in the image plane 25 covers the measuring location 40 of the measuring device 24. The light intensity reaching the measuring location 40, which is called the first light intensity in the following, is recorded by the measuring device 24.

Next, a plurality of second measuring fields 22b are imaged one after the other with the optical system 12 into the image plane 25. Here e.g. the measuring fields 22b respectively shown in a line of FIG. 2 are imaged one after the other. If measuring fields 22b of the first hierarchy plane (n=1) are to be imaged, either all or most of the eight measuring fields 22b disposed in the line identified by (a) or the four measuring fields 22b disposed in the line identified by (s) can be imaged. Alternatively, measuring fields 22b illustrated in the line identified by (a) or by (s) of the second hierarchy level (n=2) can be imaged. In the same way, corresponding measuring field combinations of a third or higher hierarchy plane can also be imaged.

The second measuring fields 22b imaged one after the other have respectively in addition to a reference structure 30 a measuring structure 32 offset in relation to the reference structure 30. Here the measuring structure 32 is offset in another direction respectively in relation to the reference structure 30 in the second measuring fields 22b imaged one after the other.

The measuring fields 22b are respectively imaged onto the image plane 25 such that the reference structure 30 is imaged onto the measuring location 40. With each image the light intensity, which is called the second light intensity in the following, reaching the measuring location 40 is recorded with the measuring device 24. By calculating the difference between the second light intensity measured for an individual second measuring field 22b and the first light intensity measured by imaging the reference field 22a, the scattered light portion the scatter direction of which corresponds to the connection vector between the decentred measuring structure 32 and the reference structure 30 of the second measuring field 22b is measured.

By assessing the second light intensities of a number of second measuring fields 22b of a line identified by (a) according to FIG. 2, a scattered light distribution, directionally resolved over an angle of 360° is thereupon established with the evaluation device 28. If instead of the measuring fields identified by (a) the measuring fields 22b identified by (s) are used for measuring scattered light, the determination of the directionally-dependent scattered light distribution is restricted to an angular range of 180°. The measuring fields 22b identified by (s) respectively have measuring structures 32 and 34 disposed symmetrically to one another in relation to the reference structure 30. Using the symmetrical arrangement the prefix of the direction vector established for the corresponding scattered light portion can not be distinguished. The effect which the measuring structure 32 has upon the light intensity measured at the measuring location 40 can not be distinguished from the effect which the measuring structure 34 of the measuring field 22b has upon the light intensity measured.

According to one embodiment according to the invention measurements for N hierarchy levels are taken. The total number of measurements then comes to 1+4N×(N+1) for the general case, i.e. for the use of measuring fields 22b identified by (a). For the symmetrical case, i.e. when using measuring fields 22b identified by (s), the total number of measurements comes to 1+2N×(N+1).

FIG. 3 illustrates the difference calculation described above of the light intensities measured for the reference field 22a and the second measuring field 22b at the measuring location 40. The result of the difference calculation corresponds to a light intensity which would be recorded when imaging an effective measuring field 36 respectively shown in the right-hand region of FIG. 3 into the image plane 25 at the measuring location 40. The effective measuring fields 36 are shown in FIG. 3 for the general case (a) and the symmetrical case (s). In the general case (a) only scattered light which is scattered by an effective scattered light source 38 at the location of the measuring structure 32 into the center of the effective measuring field 36 hits the measuring location 40. In the symmetrical case the effective measuring field 36 has two effective scattered light sources 38a and 38b at the positions of the measuring structures 32 and 34.

Figure 5:
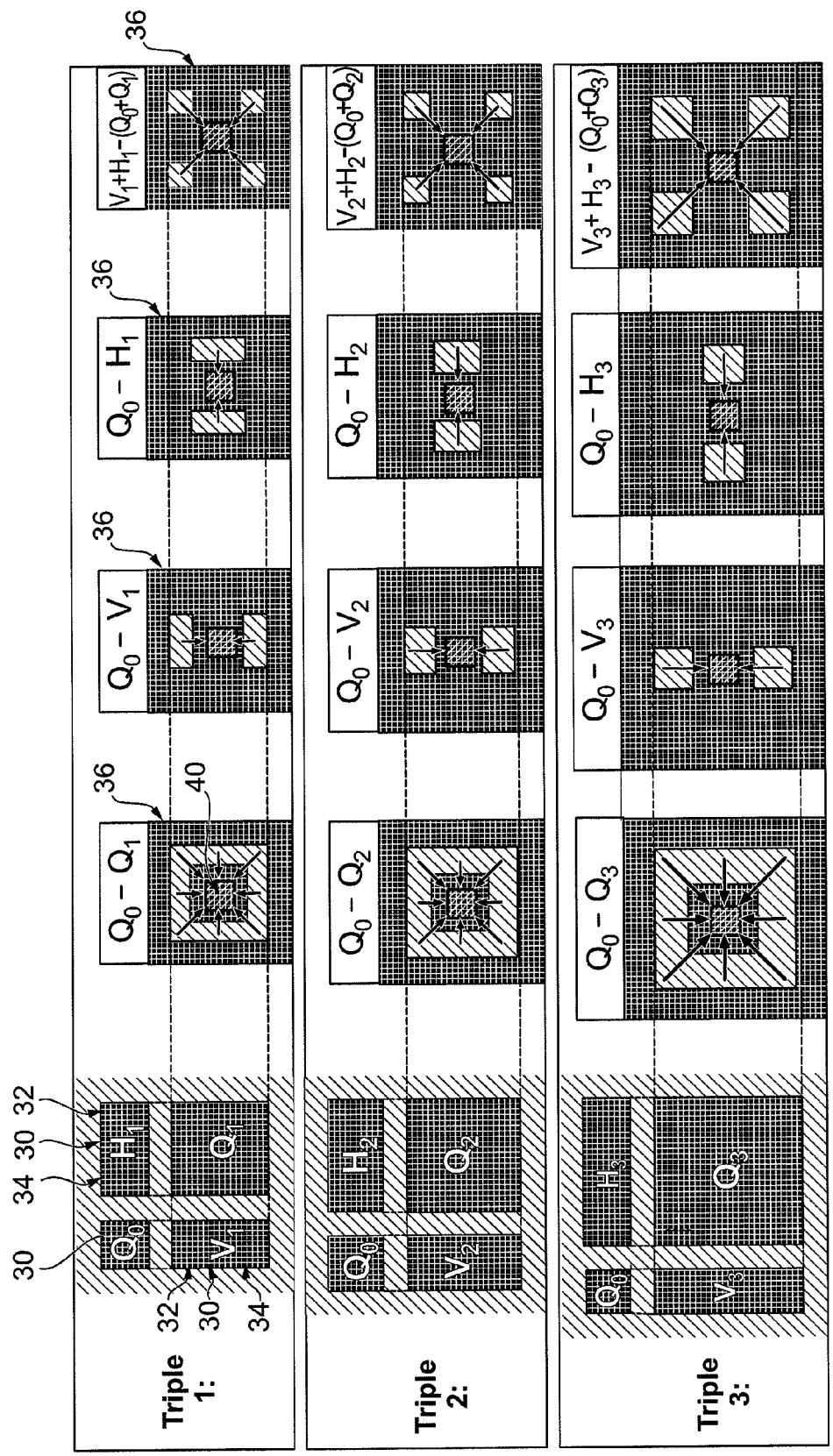

FIG. 5 illustrates a further embodiment of the measuring method according to the invention with which measuring fields 22b with triples, i.e. symmetrically arranged measuring structures according to FIG. 2 are imaged in horizontal alignment (H1, H2, H3) or vertical alignment (V1, V2, V3) in addition to the reference field 22a with the reference structure 30 ($Q_o$) and a square structure Q1, Q2 and Q3 filling the whole measuring field. Furthermore, FIG. 5 illustrates respective effective measuring fields in order to illustrate the difference calculation of individual measurements. A measuring surface of the measuring device 24 defining the measuring location 40 is shown here by hatching. The measuring area is square in shape and has in one embodiment a side length of 10 μm or smaller. In another embodiment the side length is 50 μm or larger.

Figure 6:
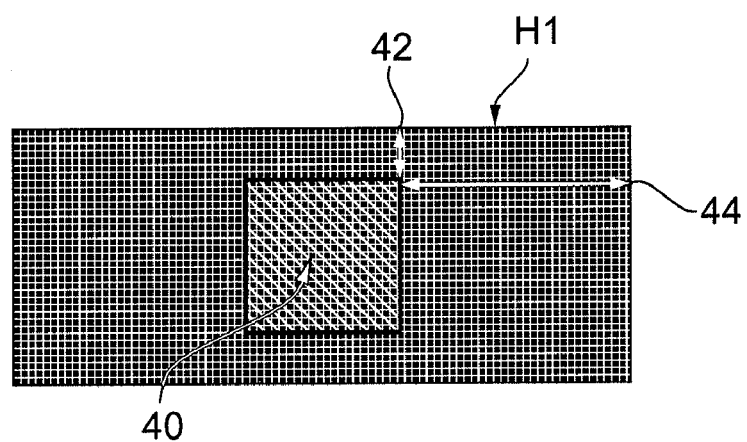
Figure 7:
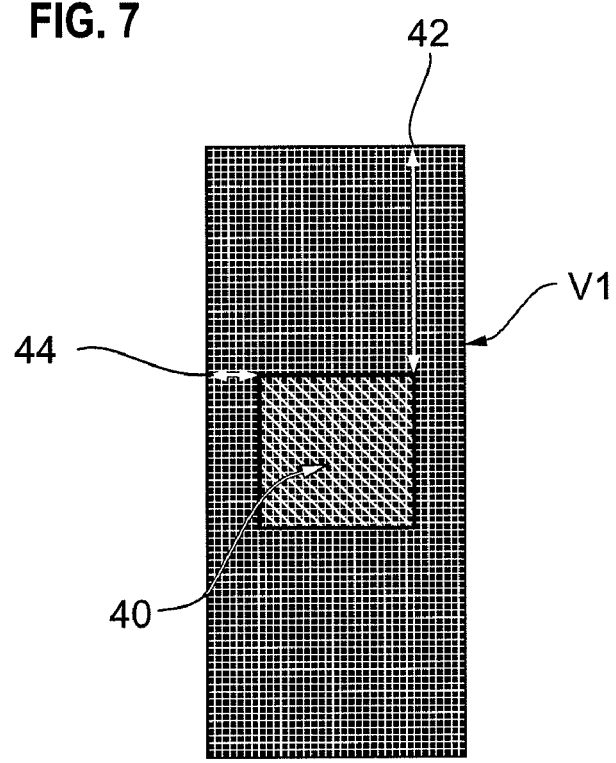
Figure 7:
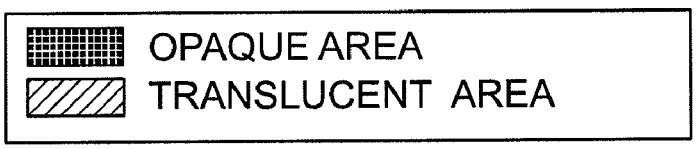

FIGS. 6 and 7 show a horizontal triple structure (H1) and a vertical triple structure (V1) according to FIG. 5 together with the measuring surface of the measuring device 24 defining the measuring location 40 in the image plane 25. In FIGS. 6 and 7 the minimum vertical ranges 42 and the minimum horizontal ranges 44 for scattered light which hits the measuring surface 40 when imaging the corresponding structures are respectively drawn in.

FIG. 4 shows a further embodiment of measuring fields 22a and 22b for implementing the method according to the invention. In this embodiment the reference field 22a identified by R is configured as a totally opaque square. The measuring field 22a therefore has a (notional) opaque square reference structure 30 disposed in the center which is surrounded by an opaque frame. The second measuring fields 22b have in addition to the notional reference structure 30 respectively first light manipulation type square measuring structures. The measuring method is implemented in the same way as the method described above, i.e. first of all the totally opaque reference field 22a is exposed, the first light intensity reaching the measuring location 40 in the center of the imaged measuring field 22a is recorded with the measuring device 24. Thereupon the further measuring fields 22b are respectively imaged into the image plane 25 and the respective second light intensity occurring here at the measuring location 40 is recorded.

Furthermore, the measuring fields 22a and 22b respectively have at least one adjustment structure (not shown in the drawing) for aligning the measuring fields 22a and 22b onto the measuring location 40. This can respectively be designed as a first light manipulation type cross, its extension being so small that light passing through the adjustment structure is irrelevant to the scattered light measurement result.

Figure 9:
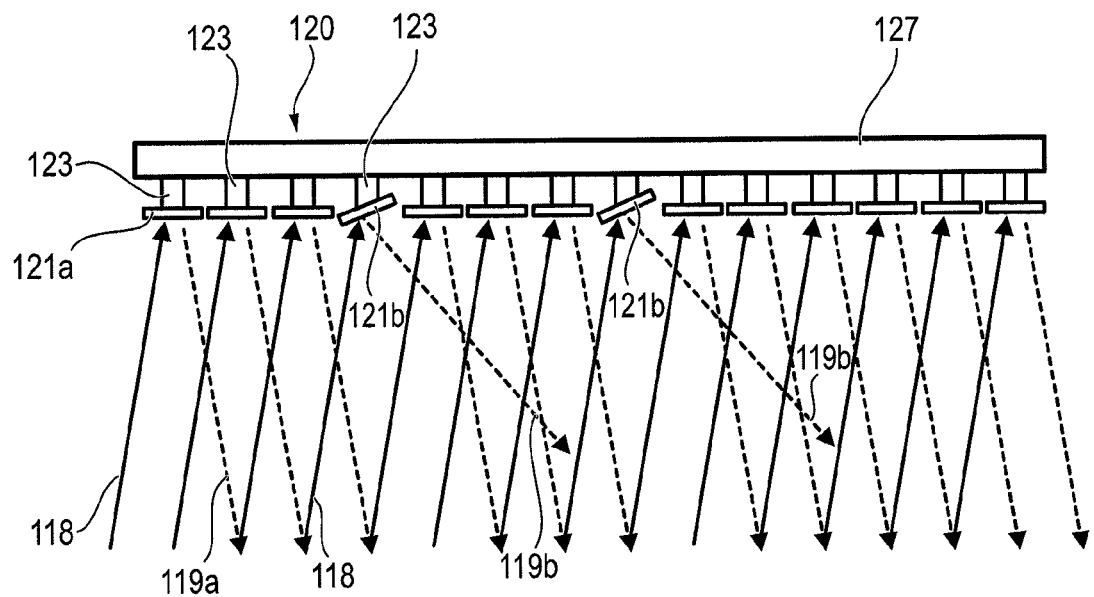
Figure 10:
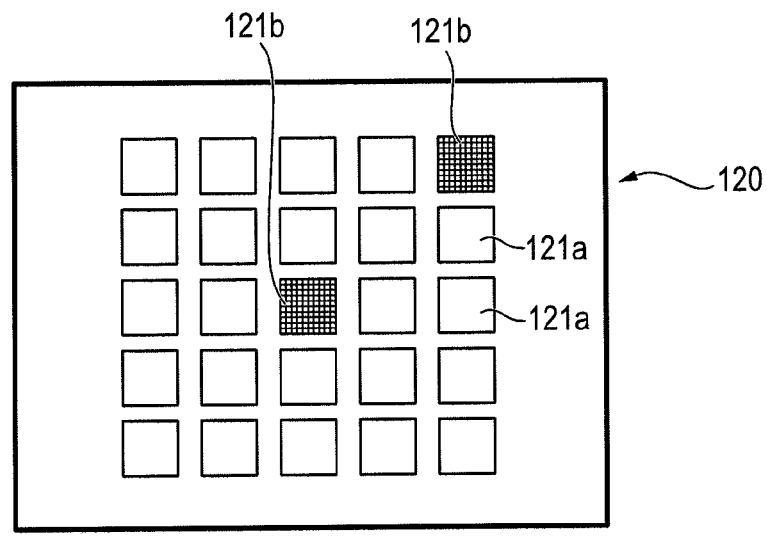

FIGS. 9 and 10 illustrate a multi mirror array 120, which can be used as an alternative to the reflective mask 20 in the projection exposure system 10 according to FIG. 8. The multi mirror array 120 uses a technology known to the person skilled in the art as micro electro mechanical system (MEMS) and contains a two dimensional array of micro mirrors 121. The micro mirrors 121 are mounted via respective 123 tilting devices on a support structure 121. The tilting devices 123 allow the single micro mirrors 121 to be tilted individually as shown in FIG. 9 for the micro mirrors designated by reference numeral 121b. In case a micro mirrors is arranged in the untilted position, as is the case for the micro mirrors in FIG. 9 designated by reference numeral 121a, an incoming light beam 118 of the illumination radiation 18, e.g. in the projection exposure tool 10 of FIG. 8, being incident on the respective micro mirror 121a is reflected into a reflected light beam 119a, which is oriented such that it passes through the projection objective 12.

In case a micro mirror 121 is arranged in the tilted position, as is the case for the micro mirrors in FIG. 9 designated by reference numeral 121b, an incoming light beam 118 of the illumination radiation 18 being incident on the respective mirror 121b is reflected into a reflected light beam 119b, which is oriented such that it is outside the capture range of the projection objective 12, i.e. the reflected light beam 119b does not pass through the projection objective 12.

A desired mask pattern can be flexibly configured by properly adjusting the respective micro mirrors 121. FIG. 10 shows an example of such a configuration of the multi mirror array 120 forming the measuring field 22b shown in FIG. 2 in the line designated by "2." on the third position. The tilted micro mirror 121b of FIG. 10 arranged in the center of the arrangement forms the opaque reference structure 30 and the tilted micro mirror 121b in the upper right corner forms the "opaque" measurement structure 32. The remaining micro mirrors 121a form "translucent" areas of the measuring field.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A method of measuring scattered light on an optical system comprising:
providing a first measuring field and a second measuring field, both measuring fields respectively being either of a first light manipulation type or a second light manipulation type, which first light manipulation type is configured to cause incoming light to enter the optical system and which second light manipulation type is configured to prevent incoming light from entering the optical system, and both measuring fields respectively having a second light manipulation type reference structure and a respective measuring structure, which measuring structures are of the second light manipulation type where the measuring fields are of the first light manipulation type, and are first light manipulation type regions of the measuring fields where the measuring fields are of the second light manipulation type,
wherein the measuring structures of the respective measuring fields are offset in different directions in relation to the respective reference structure,
imaging the first measuring field with the optical system into an image plane and measuring a first light intensity produced at a location in the region of the image of the reference structure of the first measuring field, and
imaging the second measuring field with the optical system into the image plane and measuring a second light intensity produced at a location in the region of the image of the reference structure of the second measuring field.

2. The method according to claim 1,
wherein elements of the first light manipulation type are translucent elements and elements of the second light manipulation type are opaque elements.

3. The method according to claim 1,
wherein elements of the first light manipulation type are light reflecting elements and elements of the second light manipulation type are light absorbing elements.

4. The method according to claim 1,
wherein elements of the first light manipulation type are formed by micro-mirrors aligned to direct incoming light into the optical system and elements of the second light manipulation type are formed by micro-mirrors aligned to direct incoming light into directions outside a capture range of the optical system.

5. The method according to claim 1,
wherein the reference structures of both fields are imaged onto the same measuring location.

6. The method according to claim 1,
wherein the fields are imaged into the image plane using light in an extreme ultraviolet wavelength range.

7. The method according to claim 1,
wherein the respective reference structure and the respective measuring structure are respectively second light manipulation type regions of a corresponding measuring field disposed in a first light manipulation type environment.

8. The method according claim 1,
wherein the respective reference structure is a respective second light manipulation type region of a corresponding field disposed in a second light manipulation type environment, and the respective measuring structure is a first light manipulation type region of a corresponding measuring field disposed in a second light manipulation type environment.

9. The method according to claim 1,
further comprising: establishing a measurement result in form of a directionally resolved scattered light distribution by evaluating the first light intensity measured and the second light intensity measured.

10. The method according to claim 9,
further comprising: determining an exposure correction for reducing the scattered light of the optical system during operation of the optical system from the measurement result.

11. An apparatus for measuring scattered light on an optical system, configured to implement the method according to claim 1.

12. A method of measuring scattered light on an optical system comprising:
providing a reference field and a measuring field, both fields respectively being either of a first light manipulation type or a second light manipulation type, which first light manipulation type is configured to cause incoming light to enter the optical system and which second light manipulation type is configured to prevent incoming light from entering the optical system,
wherein both fields respectively have a second light manipulation type reference structure, the measuring field additionally having a measuring structure, and the measuring structure is of the second light manipulation type where the fields are of the first light manipulation type, and is a first light manipulation type region of the measuring field where the fields are of the second light manipulation type,
wherein a center area of the measuring structure is offset in relation to a center area of an associated reference structure,
imaging the reference field with the optical system into an image plane and measuring a first light intensity produced at a measuring location in the region of the image of the reference structure of the reference field, and
imaging the measuring field with the optical system into the image plane and measuring a second light intensity produced at a measuring location in the region of the image of the reference structure of the measuring field,
wherein the image of the measuring structure in the image plane is offset in relation to the measuring location in the region of the image of the reference structure of the measuring field by at least 300 μm.

13. A mask for measuring scattered light on an optical system comprising:
a first measuring field and a second measuring field, both measuring fields respectively being either of a first light manipulation type or a second light manipulation type, which first light manipulation type is configured to cause incoming light to enter the optical system and which second light manipulation type is configured to prevent incoming light from entering the optical system, and both measuring fields respectively having a second light manipulation type reference structure and a respective measuring structure, which measuring structures are of the second light manipulation type where the measuring fields are of the first light manipulation type, and are first light manipulation type regions of the measuring fields where the measuring fields are of the second light manipulation type, wherein the measuring structures of the respective measuring fields are offset in different directions in relation to the respective reference structure.

14. An apparatus for measuring scattered light on an optical system comprising:
- a first measuring field and a second measuring field, both measuring fields respectively either being of a first light manipulation type or a second light manipulation type, which first light manipulation type is configured to cause incoming light to enter the optical system and which second light manipulation type is configured to prevent incoming light from entering the optical system, and both measuring fields respectively having a second light manipulation type reference structure and a respective measuring structure, which measuring structures are of the second light manipulation type where the measuring fields are of the first light manipulation type, and are first light manipulation type regions of the measuring fields where the measuring fields are of the second light manipulation type,
- wherein the measuring structures of the respective measuring fields are offset in different directions in relation to the respective reference structure,
- a device configured to measure a first light intensity which is produced when imaging the first measuring field with the optical system into an image plane, the device configured to measure the first light intensity being disposed at a measuring location in the region of the image of the reference structure of the first measuring field, and
- a device configured to measure a second light intensity which is produced when imaging the second measuring field with the optical system into the image plane, the device configured to measure the second light intensity being disposed at a measuring location in the region of the image of the reference structure of the second measuring field.

15. The apparatus according to claim 14,
- wherein the device configured to measure the first light intensity and the device configured to measure the second light intensity are the same measuring device.

16. A projection exposure tool for microlithography, configured for operation in an extreme ultraviolet wavelength range and comprising a measuring apparatus configured to perform a directionally resolved scattered light measurement inside the projection exposure tool, wherein the measuring apparatus comprises a plurality of fields disposed for placement in a mask plane of the projection exposure tool for the scattered light measurement, and wherein the fields all include a reference structure and at least one of the fields includes a measuring structure offset from the reference structure.

17. The projection exposure tool according to claim 16,
- further comprising a control apparatus configured to control an exposure operation of the projection exposure tool dependent on a result of the scattered light measurement obtained by the measuring apparatus.

18. The projection exposure tool according to claim 16,
- wherein the measuring apparatus comprises a reflective mask.

19. The projection exposure tool according to claim 16,
- wherein the measuring apparatus comprises a switchable mask.

20. The projection exposure tool according to claim 16,
- wherein the measuring apparatus is securely integrated into the projection exposure tool.

21. The projection exposure tool according to claim 16,
wherein the fields are provided by a plurality of mask configurations provided by respective interchangeable mask elements.

22. The projection exposure tool according to claim 16,
wherein the fields are provided by a plurality of mask configurations provided by an arrangement of tiltably mounted micro-mirrors.

23. A projection exposure tool for microlithography, configured for operation in an extreme ultraviolet wavelength range and comprising a measuring apparatus configured to perform a directionally resolved scattered light measurement inside the projection exposure tool, wherein the measuring apparatus comprises a plurality of fields disposed for placement in the projection exposure tool for the scattered light measurement, and wherein the fields all include a reference structure and at least one of the fields includes a measuring structure offset from the reference structure.

* * * * *

UNITED STATES PATENT AND TRADEMARK OFFICE
CERTIFICATE OF CORRECTION

| | | |
|---|---|---|
| PATENT NO. | : 8,218,148 B2 | |
| APPLICATION NO. | : 12/703829 | |
| DATED | : July 10, 2012 | |
| INVENTOR(S) | : Michael Arnz | |

It is certified that error appears in the above-identified patent and that said Letters Patent is hereby corrected as shown below:

Column 7, Line 59: After "$\Delta x = N \cdot \lambda / 2NA$" insert -- . --.

Column 15, Line 26: delete "synchotron" and insert -- synchrotron --.

Column 17, Lines 12-13: delete "with-the" and insert -- with the --.

Column 20, Line 1: In Claim 8, delete "according" and insert -- according to --.

Signed and Sealed this
Fourth Day of December, 2012

David J. Kappos
*Director of the United States Patent and Trademark Office*